(12) United States Patent
Liao (10) Patent No.: US 11,018,041 B2
(45) Date of Patent: May 25, 2021

(54) CHIP TRANSFERRING METHOD (71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Changhua County (TW)

( * ) Notice: Subject to any disclaimer, the term of this patent is extended or adjusted under 35 U.S.C. 154(b) by 42 days.

(21) Appl. No.: 16/450,139

(22) Filed: Jun. 24, 2019

(65) Prior Publication Data
US 2020/0185251 A1    Jun. 11, 2020

(30) Foreign Application Priority Data

Dec. 7, 2018    (TW) ................. 107144143

(51) Int. Cl.
*H01L 21/683*    (2006.01)
*H01L 21/67*    (2006.01)
*H01L 33/62*    (2010.01)
*H01L 25/075*    (2006.01)
*B65G 47/90*    (2006.01)

(52) U.S. Cl.
CPC .......... *H01L 21/6835* (2013.01); *B65G 47/90* (2013.01); *H01L 21/67132* (2013.01); *H01L 25/0753* (2013.01); *H01L 33/62* (2013.01); *H01L 2221/68354* (2013.01); *H01L 2221/68363* (2013.01); *H01L 2221/68381* (2013.01); *H01L 2933/0066* (2013.01)

(58) Field of Classification Search
CPC ........................... H01L 21/6835; H01L 33/62
USPC .......................................................... 438/28
See application file for complete search history.

(56) References Cited

U.S. PATENT DOCUMENTS

| | | | |
|---|---|---|---|
| 7,595,219 B2* | 9/2009 | Ishikawa | G06K 19/07718 257/E21.499 |
| 2008/0210368 A1* | 9/2008 | Zakel | H01L 24/31 156/230 |
| 2009/0297300 A1* | 12/2009 | Brod | H01L 21/67144 414/222.01 |
| 2018/0130683 A1* | 5/2018 | Hendriks | H01L 21/67356 |
| 2019/0122917 A1* | 4/2019 | Lohmeier | H01L 21/67144 |
| 2019/0304816 A1* | 10/2019 | Kwag | H01L 25/0753 |

* cited by examiner

*Primary Examiner* — Jami Valentine Miller
(74) *Attorney, Agent, or Firm* — Li & Cai Intellectual Property (USA) Office (57) ABSTRACT

The chip transfer method includes: firstly, (A) providing a carrier film carrying a plurality of chips and a substrate having an adhesive layer; next, (B) disposing the carrier film opposite the substrate so that the chips face the adhesive layer; then, (C) using an abutting element to pass through the carrier film to abut at least one of the chips, so that the chip is detached from the carrier film and attached to the adhesive layer; finally, (D) repeating step (C) to detach the remaining chips from the carrier film and attach the remaining chips to the adhesive layer.

4 Claims, 9 Drawing Sheets

CHIP TRANSFERRING METHOD

CROSS-REFERENCE TO RELATED PATENT APPLICATION

This application claims the benefit of priority to Taiwan Patent Application No. 107144143, filed on Dec. 7, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a transferring method and a transferring device, and more particularly to a chip transferring method and a chip transferring device.

BACKGROUND OF THE DISCLOSURE

Generally, when the prepared chip array is transferred to a substrate or panel of different size, the time required for the migration is long due to the complicated process.

Therefore, improving the efficiency and speed of chip transferring through structural design or procedural improvement has become one of the important issues to be solved in the technical field of the present disclosure.

SUMMARY OF THE DISCLOSURE

In response to the above-referenced technical inadequacies, the present disclosure provides a chip transferring method and chip transferring device.

In one aspect, the present disclosure provides a chip transferring method, including: firstly, (A) providing a carrier film carrying a plurality of chips and a substrate having an adhesive layer; next, (B) disposing the carrier film to be opposite to the substrate so that the chips face the adhesive layer; then, (C) using an abutting element to pass through the carrier film to abut at least one of the chips, so that the chip is detached from the carrier film and attached to the adhesive layer; finally, (D) repeating step (C) to detach the remaining chips from the carrier film and attach the remaining chips to the adhesive layer.

In one aspect, the present disclosure provides a chip transferring device, including a first carrier board, a second carrier board, and an abutting element. The first carrier board and the second carrier board correspond to each other and disposed along a vertical direction. A carrier film carrying a plurality of chips is disposed on the first carrier board, a substrate having an adhesive layer is disposed on the second carrier board, and the carrier film is disposed opposite to the substrate so that the chips face the adhesive layer. The abutting element passes through the carrier film and abuts at least one of the chips, so that the chip is detached from the carrier film and attached to the adhesive layer.

In one aspect, the present disclosure provides a chip transferring device, including a first carrier board, a second carrier board, and an abutting element. The first carrier board is used to carry a carrier film carrying a plurality of chips. The second carrier board is used to carry a substrate with an adhesive layer. The abutting element is placed above or below the first carrier board. The first carrier board, the second carrier board, and the abutting element are disposed along a vertical direction.

Therefore, one of the beneficial effects of the present disclosure is that by the technical features of "(A) providing a carrier film carrying a plurality of chips and a substrate having an adhesive layer," "(B) disposing the carrier film to be opposite to the substrate so that the chips face the adhesive layer," "(C) using an abutting element to pass through the carrier film to abut at least one of the chips, so that the chip is detached from the carrier film and attached to the adhesive layer" and "(D) repeating step (C) to detach the remaining chips from the carrier film and attach the remaining chips to the adhesive layer," the efficiency and speed of chip transferring can be improved.

Another beneficial effect of the present disclosure is that, by the technical features of "the first carrier board and the second carrier board being disposed corresponding to each other and extending along the vertical direction," "a carrier film carrying a plurality of chips being disposed on the first carrier board," "a substrate having an adhesive layer being disposed in the a second carrier board," "the carrier film being disposed opposite to the substrate so that the chips face the adhesive layer" and "the abutting element passing through the carrier film and abutting at least one of the chips so that the chip is detached from the carrier film and attached to the adhesive layer," the efficiency and speed of chip transferring can be improved.

Yet another beneficial effect of the present disclosure is that, by the technical features of "the first carrier board for carrying a carrier film carrying the plurality of chips," "the second carrier board for carrying a substrate with an adhesive layer," "the abutting element being disposed above or below the first carrier board" and "the first carrier board, the second carrier board, and the abutting element being disposed along a vertical direction," the efficiency and speed of chip transferring can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
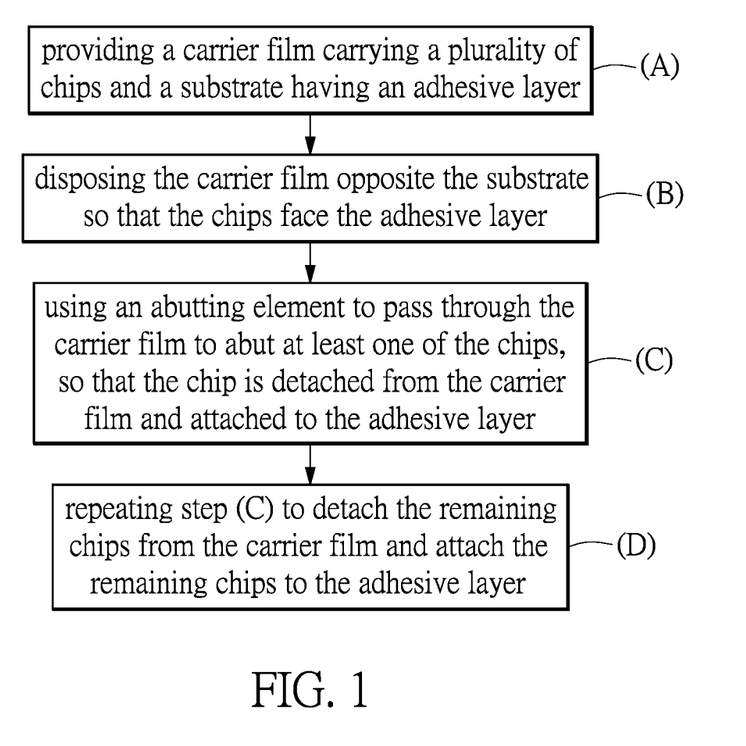
FIG. 1 is a flow chart of a chip transferring method according to a first embodiment of the present disclosure.
Figure 2:
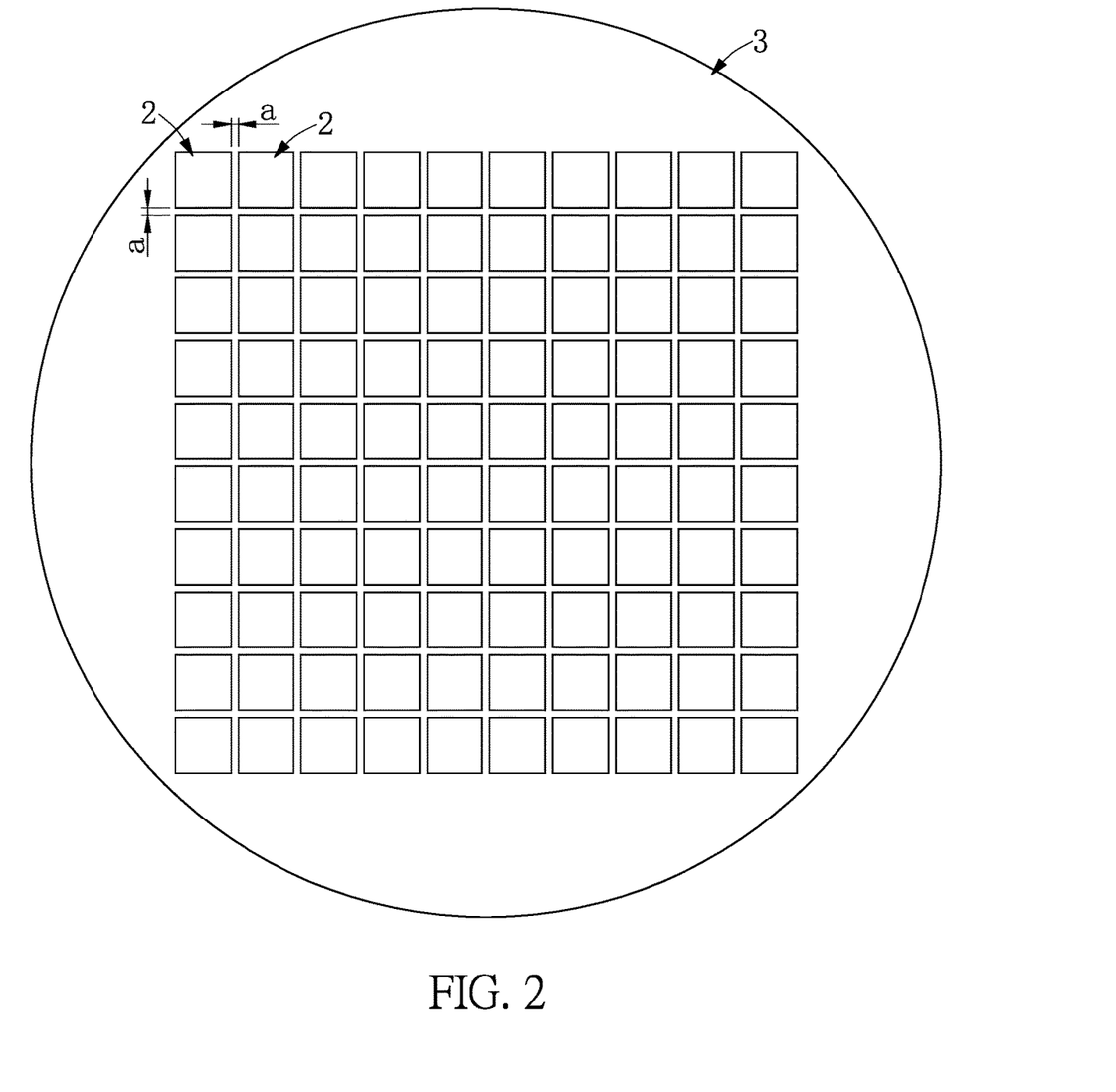
FIG. 2 is a first top view of a carrier film according to the first embodiment of the present disclosure.
Figure 3:
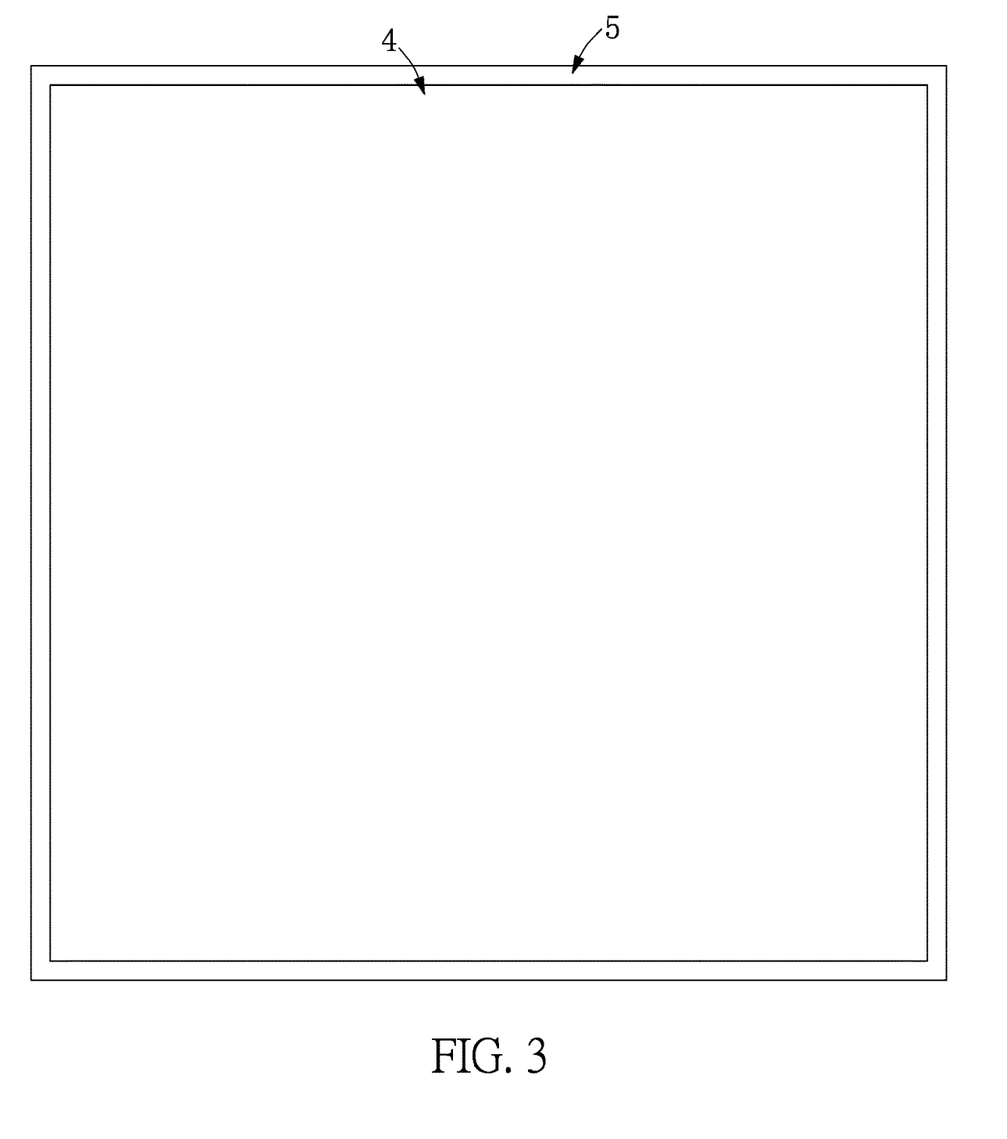
FIG. 3 is a top view of a substrate according to the first embodiment of the present disclosure.

Referring to FIG. 1 to FIG. 7, a first embodiment of the present disclosure provides a chip transferring method, which includes at least the following steps:

Firstly, as shown in FIG. 1 to FIG. 3, the chip transferring method of the present disclosure provides a carrier film 3 that carries a plurality of chips 2 and a substrate 5 that has an adhesive layer 4 (step (A)).

For example, as shown in FIG. 1 to FIG. 3, in the step (A) of the present disclosure, a plurality of chips 2 can be carried by a carrier film 3 (such as a blue PVC film, but the present disclosure is not limited thereto). The adjacent chip 2 has a preset spacing a. The carrier film 3 can be a blue PVC film, and the chip 2 can be a light emitting diode or another type of chip, but the present disclosure is not limited thereto. Moreover, an adhesive layer 4 may be formed on the substrate 5. The substrate 5 may be a glass substrate, and the adhesive layer 4 may be a UV glue, a thermosetting glue or an AB glue, but the present disclosure is not limited thereto.

However, the above-mentioned examples are only one of the embodiments and the present disclosure is not limited thereto. Next, as shown in FIG. 1 to FIG. 4, the carrier film 3 is disposed opposite to the substrate 5 so that the chip 2 faces the adhesive layer 4 (step (B)). For example, in the step (B) of the present disclosure, the carrier film 3 may be located below the substrate 5, and one side of the carrier film 3 carrying the plurality of chips 2 faces the adhesive layer 4 of the substrate 5. However, the above-mentioned examples are only one of the embodiments and the present disclosure is not limited thereto.

Figure 4:
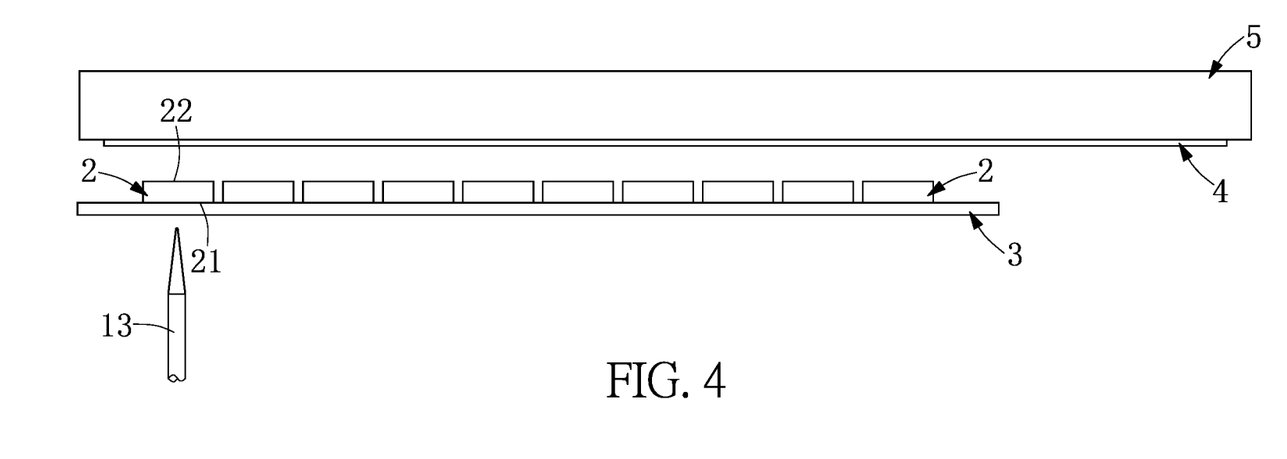
FIG. 4 is a flow chart of step (B) of the chip transferring method according to the first embodiment of the present disclosure.
Figure 5:
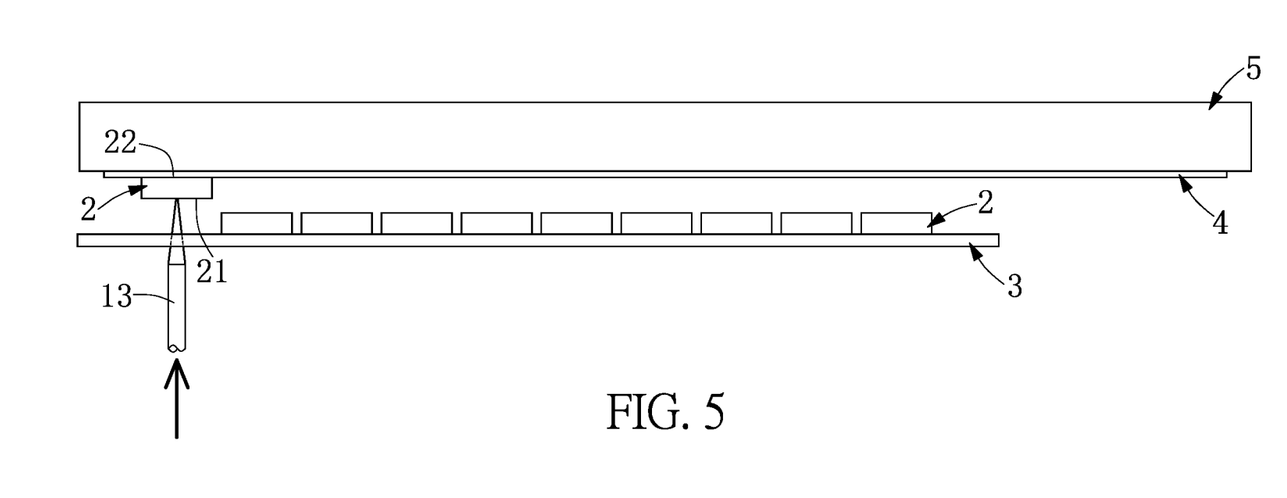
FIG. 5 is a flow chart of step (C) of the chip transferring method according to the first embodiment of the present disclosure.
Figure 6:
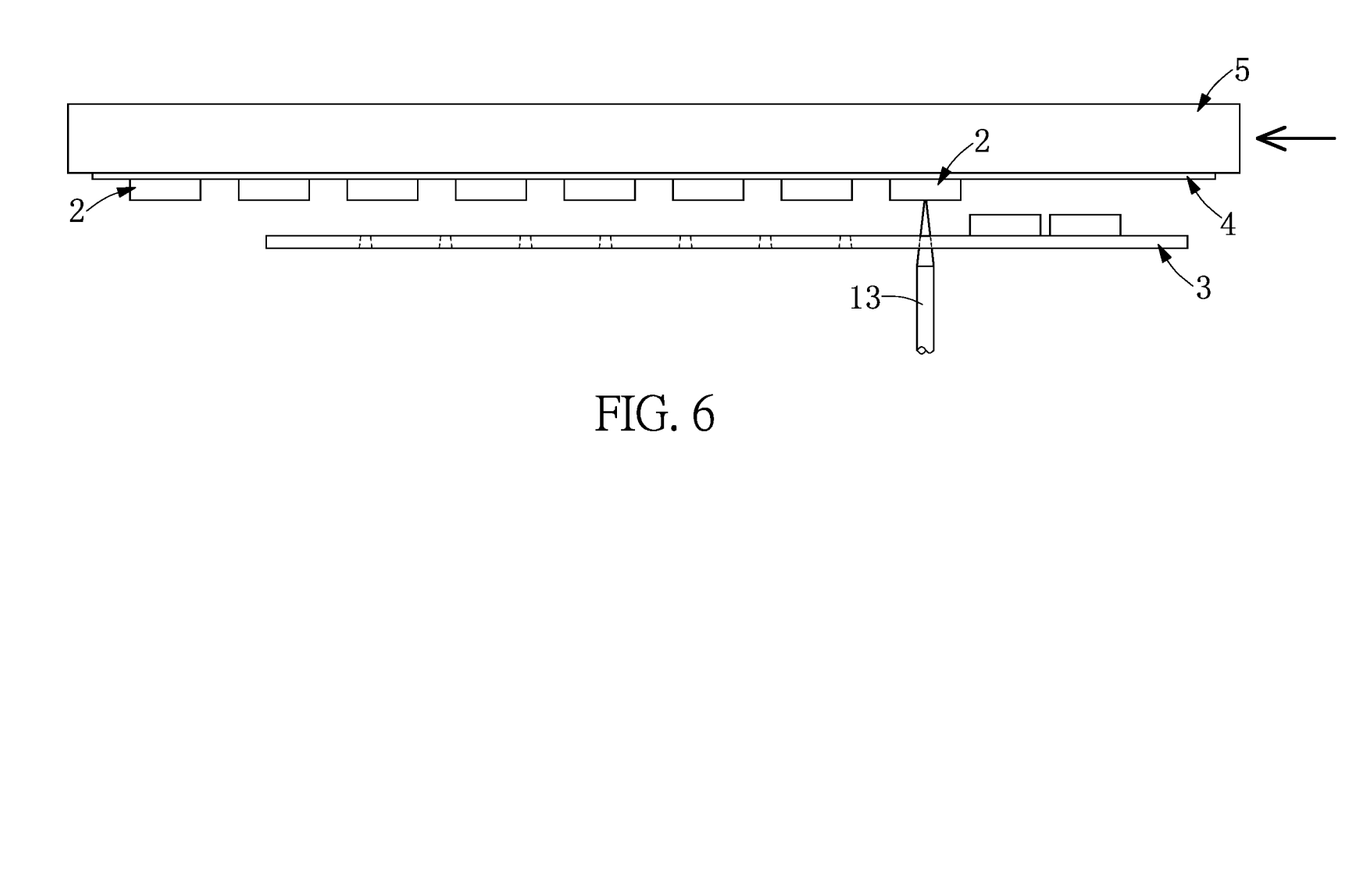
FIG. 6 is a flow chart of step (D) of the chip transferring method according to the first embodiment of the present disclosure.
Figure 7:
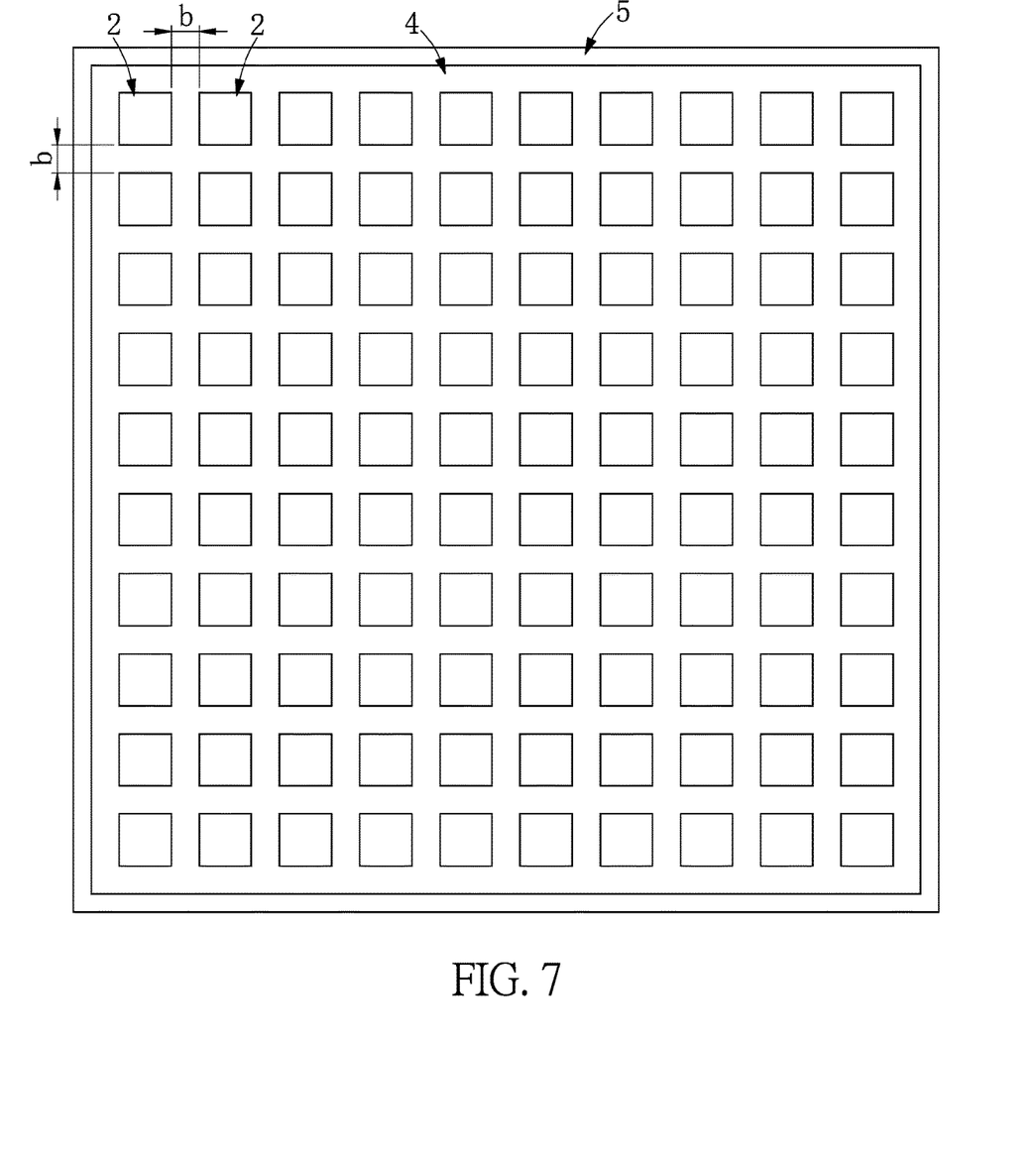
FIG. 7 is a second top view of a carrier film according to the first embodiment of the present disclosure.

Then, as shown in FIG. 1, FIG. 4 and FIG. 5, an abutting element 13 is partially passed through the carrier film 3 to abut at least one chip 2, so that the chip 2 is detached from the carrier film 3 and attached to the adhesive layer 4 (step (C)).

For example, as shown in FIG. 1, FIG. 4 and FIG. 5, in the step (C) of the present disclosure, that is, when the chip 2 is transferred, the abutting element 13 can be passed through the carrier film 3, and the chip 2 corresponding to the abutting element 13 can be abutted to contact with the adhesive layer 4, so that the chip 2 is detached from the carrier film 3 and attached to the adhesive layer 4. When the abutting element 13 abuts against the chip 2, the chip 2 may be attached to the adhesive layer 4 after the bottom surface 21 is completely detached from the carrier film 3; or the chip 2 may be attached to the adhesive layer 4 after the bottom surface 21 is partially detached from the carrier film 3. The top surface 22 of chip 2 is attached to the adhesive layer 4. In addition, the material of the abutting element 13 may be metal or plastic, and the abutting element 13 may be sharp or obtuse for the portion against the chip 2. However, the above-mentioned examples illustrate only one of the embodiments, and the present disclosure is not limited thereto.

Finally, referring to FIG. 1, FIG. 5, FIG. 6, and FIG. 7, step (C) is repeated to sequentially attach the remaining chips 2 from the carrier film 3 and attach the remaining chips 2 to the adhesive layer 4 (step (D)).

For example, as shown in FIG. 1, FIG. 5, FIG. 6, and FIG. 7, in the step (D) of the present disclosure, the above step (C) may be repeated, that is, the abutting element 13 is repeatedly passed through the carrier film 3, and the chip 2 on the carrier film 3 is sequentially or randomly abutted so as to attach the chip 2 to the adhesive layer 4. Further, the carrier film 3 can be horizontally shifted with respect to the substrate 5 by the carrier, and the substrate 5 can also be horizontally shifted with respect to the carrier film 3 by the carrier. Therefore, after the chip 2 on the carrier film 3 is transferred to the adhesive layer 4 of the substrate 5, the adjacent chip 2 on the adhesive layer 4 has a predetermined spacing b, and the predetermined spacing b is greater than the preset spacing a. The distance parameter between the preset spacing a and the predetermined spacing b may depend on the user or manufacturer. However, the above-mentioned examples illustrate only one of the embodiments, and the present disclosure is not limited thereto.

Second Embodiment

Figure 8:
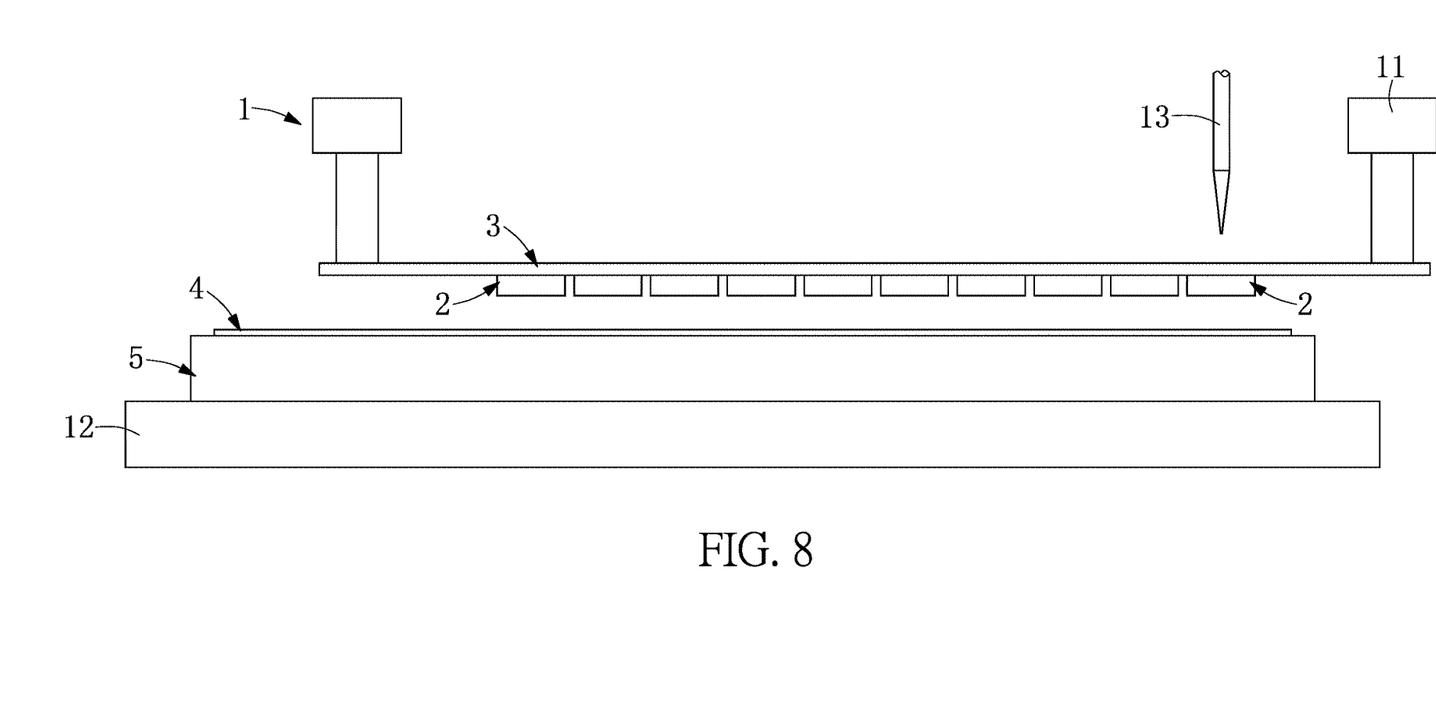
FIG. 8 is a structural schematic view of a chip transferring device according to a second embodiment of the present disclosure.

Referring to FIG. 8 together with FIG. 1 to FIG. 7, a second embodiment of the present disclosure provides a chip transferring method that is slightly similar to the chip transferring method of the first embodiment. Therefore, similar steps will not be repeated herein. Further, according to FIG. 8 and FIG. 4, the difference between the second embodiment of the present disclosure and the first embodiment is that, in the step (B), the carrier film 3 is located above the substrate 5. For example, the chip transfer method of the present embodiment can also provide a carrier film 3 carrying a plurality of chips 2 and a substrate 5 that has an adhesive layer 4, but the substrate 5 is disposed under the carrier film 3, the adhesive layer 4 on the substrate 5 faces the carrier film 3, and the plurality of chips 2 on the carrier film 3 faces the adhesive layer 4. Then, step (C) and step (D) are further performed to attach a plurality of chips 2 on the carrier film 3 to the adhesive layer 4.

Further, with reference to FIG. 1 to FIG. 8, a second embodiment of the present disclosure further provides a chip transfer device 1 including a first carrier board 11, a second carrier board 12, and an abutting element 13. The first carrier board 11 and the second carrier board 12 corresponding to each other are disposed along the vertical direction. The carrier film 3 carrying the plurality of chips 2 is disposed on the first carrier board 11, the substrate 5 having an adhesive layer 4 is disposed on the second carrier board 12, and the carrier film 3 faces the substrate 5 so that the chip 2 faces the adhesive layer 4. The abutting element 13 partially passes through the carrier film 3 and abuts against at least one chip 2, so that the chip 2 is detached from the carrier film 3 and attached to the adhesive layer 4.

For example, as shown in FIG. 8, the chip transfer device 1 of the present disclosure can secure the carrier film 3 through suction or clamping by the first carrier board 11, and can secure the substrate 5 through suction or clamping by the second carrier board 12. The first carrier board 11 and the second carrier board 12 correspond to each other and are disposed along a vertical direction. The manner that the first carrier board 11 and the second carrier board 12 are secured is not limited to the above-mentioned example, and the first carrier board 11 can be horizontally displaced with respect to the second carrier board 12, and the second carrier board 12 can also be horizontally displaced with respect to the first carrier board 11. Then, through the method of the abutting element 13 passing through the carrier film 3 and abutting the chip 2, the plurality of chips 2 on the carrier film 3 are sequentially transferred to the adhesive layer 4 of the substrate 5. However, the above-mentioned examples are only one of the embodiments and the present disclosure is not limited thereto.

It should be noted that, the chip transfer device 1 of the present embodiment can also be used for the implementation of the carrier film 3 located under the substrate 5, and the present disclosure is not limited to the above-mentioned embodiment.

In addition, as shown in FIG. 8, a second embodiment of the present disclosure further provides a chip transfer device 1 including a first carrier board 11, a second carrier board 12, and an abutting element 13. The first carrier board 11 is for carrying a carrier film 3 carrying a plurality of chips 2. The second carrier board 12 is used to carry a substrate 5 having an adhesive layer 4. The abutting element 13 is disposed above or below the first carrier board 11. The first carrier board 11, the second carrier board 12, and the abutting element 13 are disposed along the vertical direction.

Third Embodiment

Figure 9:
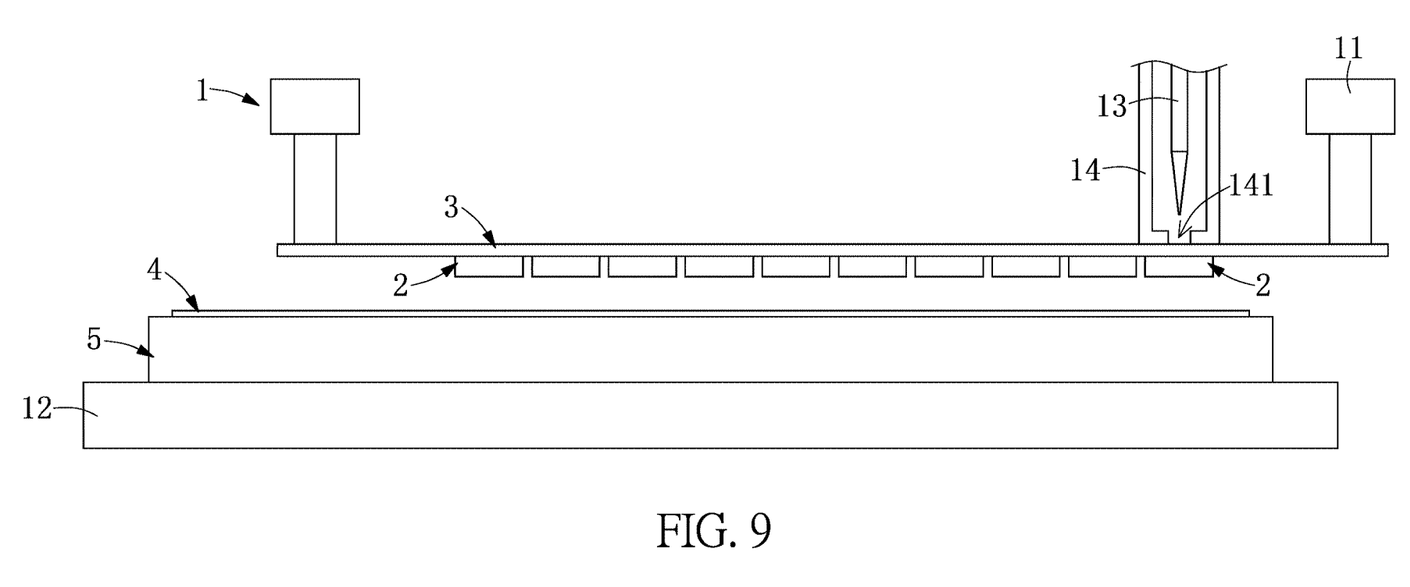
FIG. 9 is a structural schematic view of a chip transferring device according to a third embodiment of the present disclosure.

Referring to FIG. 9, together with FIG. 1 to FIG. 8, a chip transferring device according to a third embodiment of the present disclosure is slightly similar to that of the second embodiment. Therefore, similar steps will not be repeated herein. Further, according to FIG. 9 and FIG. 8, the difference between the third embodiment of the present disclosure and the second embodiment is that the chip transferring device 1 of the present embodiment further includes: a housing 14, having an opening 141, and an abutting element 13 passing through the opening 141 to abut the chip 2.

For example, as shown in FIG. 9, the chip transferring device 1 of the present disclosure may further include a housing 14, which may correspond to the abutting element 13 and has an opening 141, and the abutting element 13 can be movably located in the housing 14. Therefore, when the step (C) or the step (D) is performed, the chip transfer device 1 may first pass the housing 14 against the carrier film 3. Next, the abutting element 13 can pierce the carrier film 3 by passing through the opening 141, and then pass through the carrier film 3 to abut the chip 2. In addition, the chip transfer device 1 of the present disclosure can also be combined with a vacuum pump to provide a suction force through the opening 141, so that the housing 14 can suction the carrier film 3. However, the above-mentioned examples are only one of the embodiments and the present disclosure is not limited thereto.

It should be noted that, the chip transfer device 1 of the present embodiment can also be used for the implementation of the carrier film 3 located under the substrate 5, and the present disclosure is not limited to the above-mentioned embodiment.

Fourth Embodiment

Figure 10:
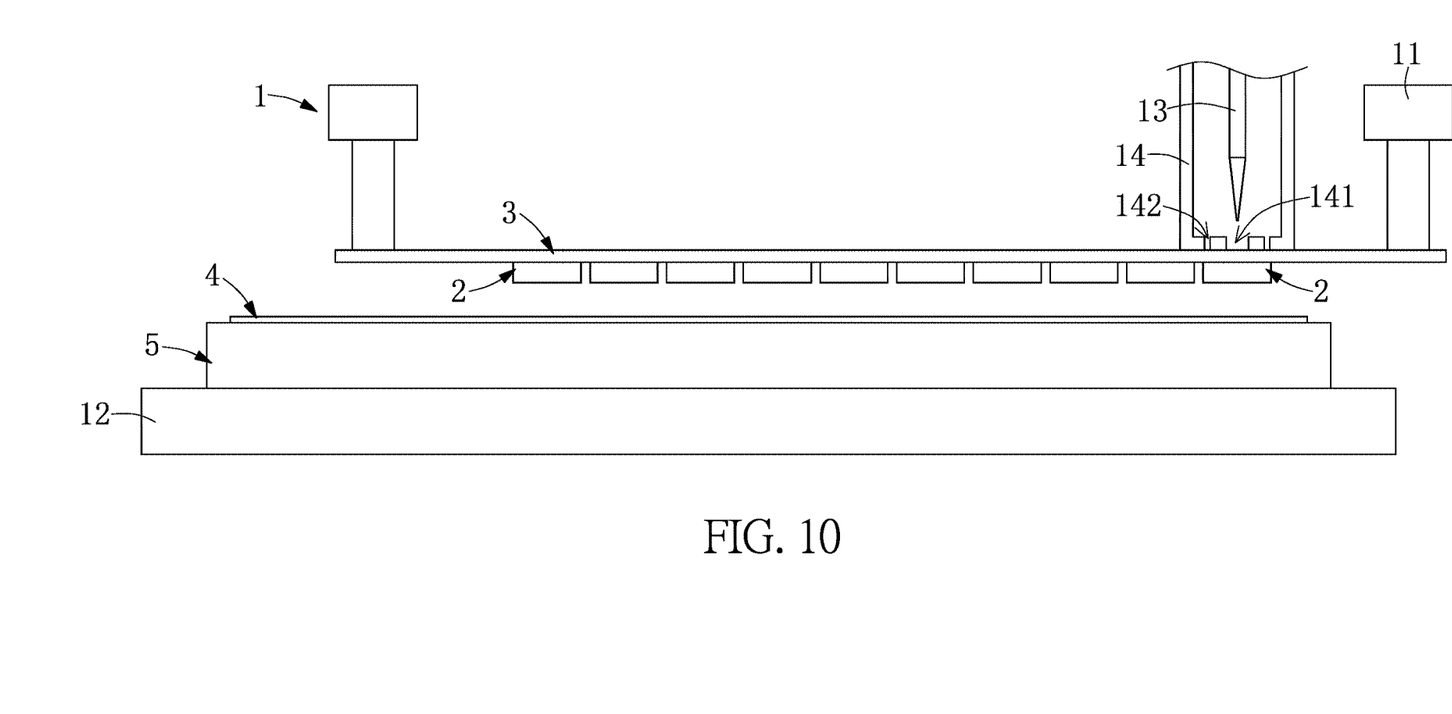
FIG. 10 is a structural schematic view of a chip transferring device according to a fourth embodiment of the present disclosure.

Referring to FIG. 10, together with FIG. 1 to FIG. 9, a chip transferring method according to a fourth embodiment of the present disclosure is slightly similar to that of the first embodiment and second embodiment. Therefore, similar steps will not be repeated herein. Further, according to FIG. 10 and FIG. 4, the difference between the fourth embodiment of the present disclosure and the first embodiment and second embodiment is that, in the step (C), the carrier film 3 is contacted by a housing 14 that has an opening 141 and a plurality of vacuum holes 142, the abutting element 13 passes through the opening 141 to abut the chip 2, and vacuum suction is then performed via the opening 141 and the vacuum hole 142 so that the housing 14 is closely attached to the carrier film 3.

For example, as shown in FIG. 10, in step (C) of the chip transfer method of the present embodiment, the abutting element 13 can be movably located in the housing 14 that has an opening 141 and a plurality of vacuum holes 142. Therefore, the carrier film 3 is contacted by the housing 14, and vacuum suction is performed with the opening 141 and the vacuum holes 142 so that the carrier film 3 is closely attached to the housing 14. Next, the carrier film 3 is pierced through the opening 141 by the abutting element 13, and then passes through the carrier film 3 to abut the chip 2. However, the above-mentioned examples are only one of the embodiments and the present disclosure is not limited thereto.

Further, the fourth embodiment of the present disclosure further provides a chip transfer device 1 which is slightly similar to the chip transfer device 1 of the second embodiment, and therefore, similar steps will not be repeated herein. Further, according to FIG. 10 and FIG. 8, the difference between the fourth embodiment of the present disclosure and second embodiment is that, the chip transferring device 1 further includes: a housing 14 that has an opening 141 and a plurality of vacuum holes 142. When the housing 14 contacts the carrier film 3, evacuation is performed with the opening 141 and the vacuum hole 142, such that the housing 14 is closely attached to the carrier film 3.

For example, as shown in FIG. 10, the chip transferring device 1 of the present disclosure may further include a housing 14, which may correspond to the abutting element 13. The housing 14 has an opening 141 and a plurality of vacuum holes 142, and the abutting element 13 is movably located in the housing 14. Therefore, when the step (C) or the step (D) is performed, the chip transfer device 1 may first pass the housing 14 against the carrier film 3. Next, evacuation is performed by the opening 141 and the vacuum holes 142 so that the carrier film 3 is suction and closely attached to the housing 14. Next, the abutting element 13 can pierce the carrier film 3 by passing through the opening 141, and then pass through the carrier film 3 to reach the chip 2. In addition, the chip transfer device 1 of the present disclosure can also cooperate with a vacuum pump to provide a suction force through the opening 141 and the vacuum holes 142, so that the housing 14 can suction the carrier film 3. However, the above-mentioned examples are only one of the embodiments and the present disclosure is not limited thereto.

It should be noted that, the chip transfer device 1 of the present embodiment can also be used for the implementation of the carrier film 3 located under the substrate 5, and the present disclosure is not limited to the above-mentioned embodiment.

In conclusion, one of the beneficial effects of the present disclosure is that by the technical features of "(A) providing a carrier film 3 carrying a plurality of chips 2 and a substrate 5 having an adhesive layer 4," "(B) disposing the carrier film to be 3 opposite to the substrate 5 so that the chips 2 face the adhesive layer 4," "(C) using an abutting element 13 to pass through the carrier film 3 to abut at least one of the chips 2, so that the chip 2 is detached from the carrier film 3 and attached to the adhesive layer 4" and "(D) repeating step (C) to detach the remaining chips 2 from the carrier film 3 and attach the remaining chips 2 to the adhesive layer 4," the efficiency and speed of chip transferring can be improved.

Another beneficial effect of the present disclosure is that, by the technical features of "the first carrier board 11 and the second carrier board 12 being disposed corresponding to each other and extending along the vertical direction," "a carrier film 3 carrying a plurality of chips 2 being disposed on the first carrier board 11," "a substrate 5 having an adhesive layer 4 being disposed in the a second carrier board 12," "the carrier film 3 being disposed opposite to the substrate 5 so that the chips 2 face the adhesive layer 4" and "the abutting element 13 passing through the carrier film 3 and abutting at least one of the chips 2 so that the chip 2 is detached from the carrier film 3 and attached to the adhesive layer 4," the efficiency and speed of chip transferring can be improved.

Yet another beneficial effect of the present disclosure is that, by the technical features of "the first carrier board 11 for carrying a carrier film 3 carrying the plurality of chips 2," "the second carrier board 12 for carrying a substrate 5 with an adhesive layer 4," "the abutting element 13 being disposed above or below the first carrier board 11" and "the first carrier board 11, the second carrier board 12, and the abutting element 13 being disposed along a vertical direction," the efficiency and speed of chip transferring can be improved.

Further, the chip transferring method and chip transferring device provided by the present disclosure has the above-mentioned technical features so as to improve the efficiency and speed of the transferring of the chips 2 to the adhesive layer 4 of the substrate 5 and shorten the time taken.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip transferring method, comprising:
   (A) providing a carrier film for carrying a plurality of chips, and providing a substrate having an adhesive layer;
   (B) disposing the carrier film to be opposite to the substrate so that the chips face the adhesive layer;
   (C) using an abutting element to abut at least one of the chips, so that the chip is detached from the carrier film and attached to the adhesive layer; and
   (D) repeating step (C) to detach the remaining chips from the carrier film and attach the remaining chips to the adhesive layer;
   wherein in step (C), the carrier film is contacted by a housing having an opening and a plurality of vacuum holes, the abutting element passes through the opening to abut the chip, and vacuum suction is then performed via the opening and the vacuum holes so that the housing is closely attached to the carrier film.

2. The chip transferring method according to claim 1, wherein in step (B), the carrier film is located above the substrate or the carrier film is located below the substrate.

3. The chip transferring method according to claim 1, wherein in step (C), a top surface of the chip is attached to the adhesive layer after the bottom surface of the chip is completely detached from the carrier film by the abutting of the abutting element.

4. The chip transferring method according to claim 1, wherein in step (C), a top surface of the chip is attached to the adhesive layer after the bottom surface of the chip is partially detached from the carrier film by the abutting of the abutting element.

* * * * *